INVENTOR
RAFAEL LANDRON, JR.
E. Mickey Hubbard
ATTORNEY

April 1, 1969 R. LANDRON, JR 3,436,605

PACKAGING PROCESS FOR SEMICONDUCTOR DEVICES AND ARTICLE OF MANUFACTURE

Filed Nov. 23, 1966 Sheet 2 of 2

INVENTOR
RAFAEL LANDRON, JR.

E. Mickey Hubbard
ATTORNEY

United States Patent Office 3,436,605

Patented Apr. 1, 1969

3,436,605

PACKAGING PROCESS FOR SEMICONDUCTOR DEVICES AND ARTICLE OF MANUFACTURE

Rafael Landron, Jr., Scottsdale, Ariz., assignor to Texas Instruments Incorporated, Dallas, Tex., a corporation of Delaware Filed Nov. 23, 1966, Ser. No. 596,527
Int. Cl. H02b *1/04*
U.S. Cl. 317—101 4 Claims

ABSTRACT OF THE DISCLOSURE

A circuit including a substrate having conductive pathways thereon and an associated header for an electronic device to be connected to the pathways are disclosed. The header includes an insulating body having opposed surfaces with a plurality of spaced pedestals extending from one surface to receive the electronic device therebetween on the one surface. Each pedestal has a rounded tip portion and at least two of the pedestals have intermediate bonding surfaces. A plurality of mutually electrically isolated metal films are provided for effecting the desired electrical connections.

This invention relates generally to semiconductor devices, and more particularly relates to the packaging of semiconductor devices for incorporation in hybrid integrated circuits or the like.

Miniaturized circuits have been developed in which the resistive, capacitive and inductive components of the circuit are formed by one or more metallized layers deposited on a substrate formed of a suitable material such as ceramic, glass or plastic. Active semiconductor components are mounted on the surface of the substrate and are electrically connected in the circuit formed on the surface of the substrate.

Various techniques have been devised for mounting the semiconductor devices, which are usually individual transistors, on the substrate and connecting the device in the circuit. For example, a ceramic header is formed having three holes extending through the header. Lead wires are passed through these holes and secured in place so that the wires project from the bottom of the header and the ends are exposed at the top surface. A transistor, or other semiconductor device, is then mounted on the top surface of the header and the expanded contact pads on the transistor electrically connected to the device using jumper wires. The lead wires extending from the bottom of the header are then placed on the circuit formed on the substrate to electrically connect the transistor into the circuit. This process is relatively expensive and is not readily adaptable to mass production.

Another technique involves machining a block of fired ceramic material to form a header having four upright posts, one at each corner of a rectangular body, leaving a flat area located centrally of the four posts. Two of the posts have intermediate ledges formed between the top of the posts and the flat area. Next a separate metallized film is depostied over the end of each of the posts having the intermediate ledges which extends down onto the respective ledges. Another metallized film is formed over the other two posts which extends down over the central surface. A semiconductor chip is then alloyed to the metallized film over the central surface and small jumped wires bonded between expanded contact pads on the semiconductor device and the respective ledges. This establishes electrical contact between the emitter and the metallized film on the end of one post, the base and the metallized film on another post, and the collector and the metallized film on the two remaining posts. The header is then inverted and the metallized film on the ends of the posts bonded to bonding pads formed on the hybrid circuit to mechanically secure the device in place and simultaneously electrically connect the transistor in the circuit. This process is relatively expensive because the header must be machined from a piece of ceramic. Each header must be metallized individually which contributes significantly to the ultimate cost. The resulting header must have four posts because it is formed by machining crossed grooves in the face of the ceramic block. As a result, the ends of the posts are relatively large which makes it very difficult to weld the posts to the circuit by ultrasonic welding techniques. A welding process using heat or soldering is undesirable because the resistors, and particularly the capacitors of the hydrid circuit, cannot be exposed to the excessive heat required for these processes. Since four contact posts are formed, considerable precision is required in the machining as well as in the formation of the hybrid circuit in order to insure that all four of the posts will properly mate with the bonding pads of the hybrid circuit.

This invention is concerned with an improved process for fabricating an improved header for connecting a semiconductor device, typically a transistor, to a hybrid circuit or the like.

Another very important object of the invention is to provide such a header which may be welded to a hybrid circuit substrate using ultrasonic welding techniques so as to avoid the application of heat.

Another object is to provide such a header which is very small and suitable for incorporation in ultraminiature circuits.

Another important object is to provide a process for producing such headers in extremely large quantities at a very low unit cost.

Another object is to provide such a device that is very reliable and mechanically rugged.

These and other objects are accomplished in accordance with the present invention by the process for fabricating a header comprising forming a wafer having a plurality of header areas with a plurality of contact posts, preferably three, protruding from each header area. The posts are spaced such that a semiconductor device can be mounted on the header between the posts. The posts are dimensioned so as to extend significantly above the upper surface of a semiconductor chip mounted on the face of the header between the posts. The wafer is then masked and the exposed surface metallized so that when the wafer is separated into individual headers, separate metallized films will be formed over the various posts. The semiconductor device can then be mounted on the face of the wafer between the posts and electrically connected to the various metallized films before the header is inverted and the metallized films over the posts bonded to a hybrid circuit.

In accordance with more specific aspects of the invention, the header areas are defined by break grooves, typically in the underside to facilitate separating the wafer into the individual header units. The wafer is preferably fabricated of ceramic material using a molding process wherein a particulate ceramic or glass material is pressed to the desired form and then fired or fused into a solid mass.

The present invention also contemplates an improved header for a transistor or other three terminal device the novel features of which are pointed out in the appended claims.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figures 1, 2, 6:
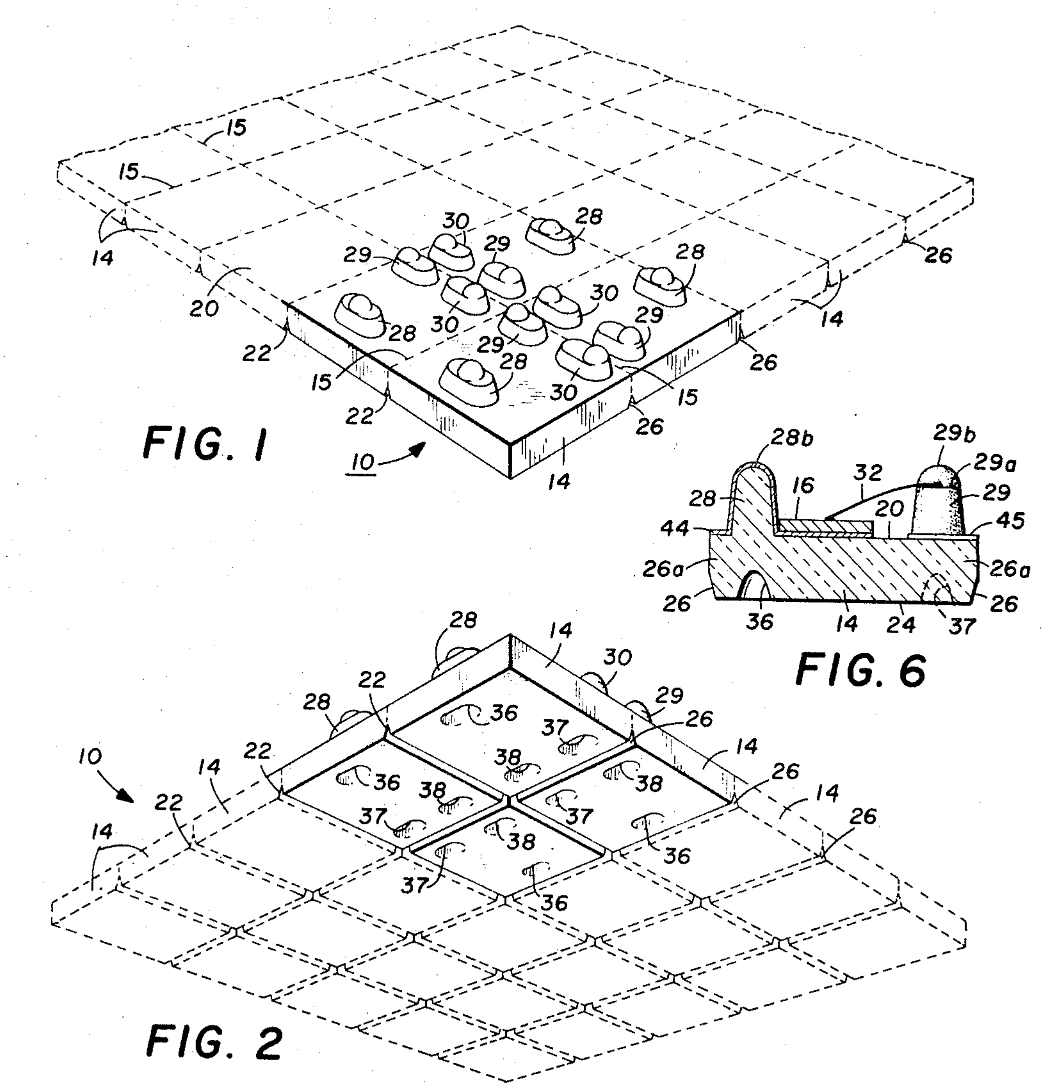
FIGURE 1 is a perspective view of the top of a portion of a wafer constructed in accordance with the present invention, and also serves to illustrate the process of the present invention.
FIGURE 2 is a perspective view of the bottom of the portion of the wafer illustrated in FIGURE 1.
FIGURE 6 is a sectional view taken substantially on lines 6—6 of FIGURE 5.
Figure 3:
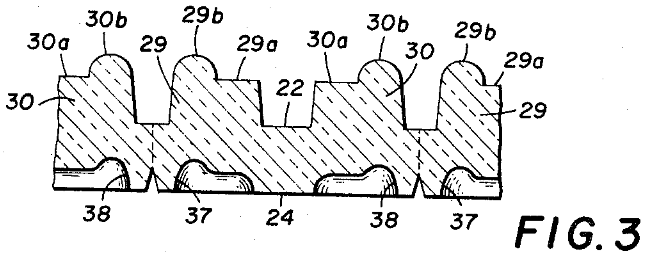
FIGURE 3 is a sectional view through a portion of the wafer shown in FIGURE 1.
Figure 4:
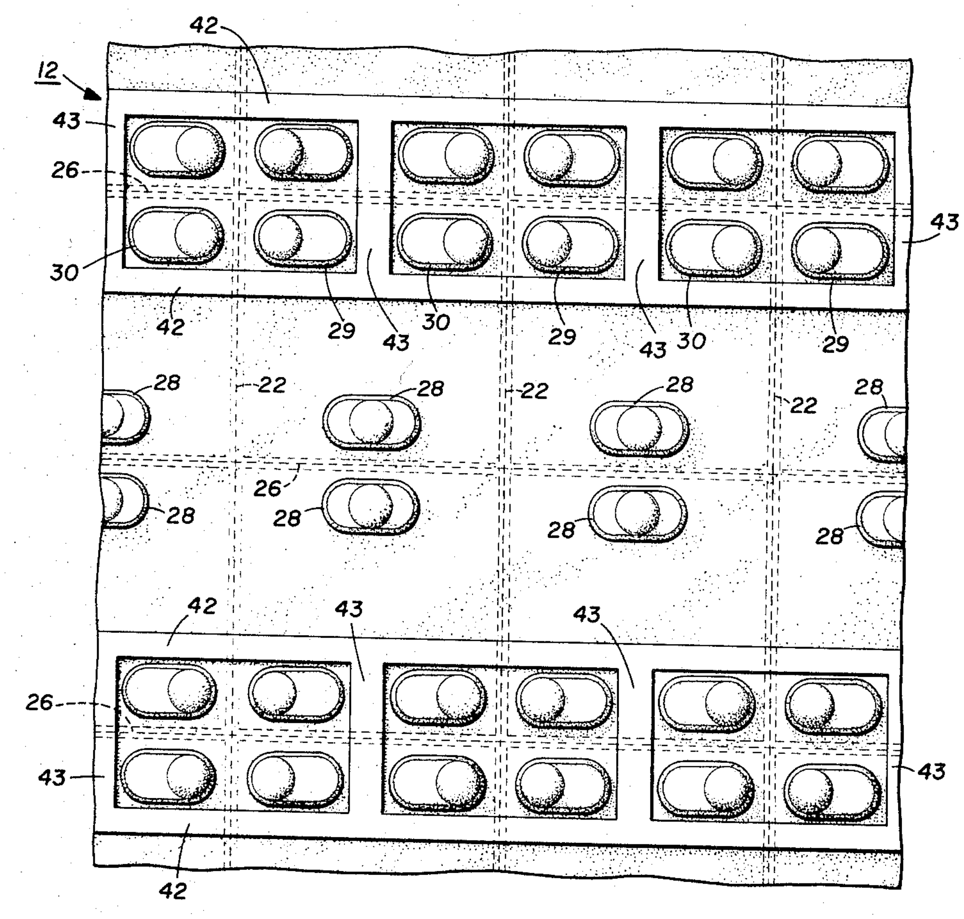
FIGURE 4 is a plan view of a portion of the wafer illustrated in FIGURE 1 showing a metallization mask in place over the wafer and serves to illustrate the process of the present invention.
Figure 5:
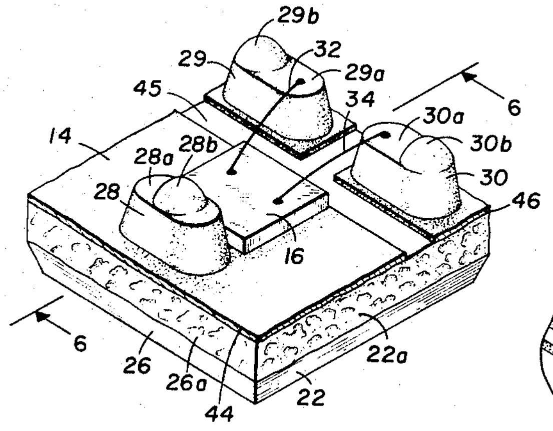
FIGURE 5 is a perspective view of a completed header with a transistor device in place.
Figure 7:
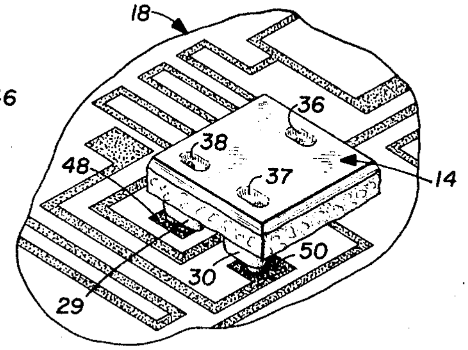
FIGURE 7 is a perspective view illustrating how the device of FIGURE 5 is emplaced in a typical hybrid circuit.

In accordance with the broader aspects of the process of the present invention, a wafer, such as the wafer 10 illustrated in FIGURES 1 and 2, having a plurality of header areas is formed by molding or other similar process. Next, the surface of the wafer 10 is metallized through a suitable mask 12 as illustrated in FIGURE 4. The wafer is then separated into the individual header areas to provide individual headers, one of which is illustrated in FIGURE 5 and designated by the reference numeral 14. A semiconductor device 16 is mounted on the header and then the header 14 is inverted and mounted on the face of a hybrid or other similar printed circuit 18, as shown in FIGURE 7.

The wafer 10 is formed from a ceramic, glass or other moldable material which is a good insulator and which can be readily separated into the very small individual headers. Neither the patricular material nor the molding step, per se, is novel and a number of different materials and molding processes can be used within the broader aspects of the invention. For example, the wafer 10 may be molded using a conventional Dorst press from a conventional alumina ceramic material using conventional ceramic molding techniques. After the ceramic material has been pressed into the form of the wafer 10 by the Dorst press, the wafers are fired using conventional ceramic techniques to complete the wafer.

The wafer 10 typically has about one hundred individual header areas 14, defined by the dotted lines 15 on the upper surface 20 of the wafer, and the set of parallel preferential break grooves 22 formed in the lower surface 24 of the wafer 10 which intersect a second set of parallel preferential break grooves 26, also formed in the lower surface 24, at right nagles. The break grooves 22 and 26 preferably extend about one-third of the way through the body of the wafer 10 to facilitate breaking the wafer into the individual headers as will presently be described. Thus, it will be noted that the header areas are arrayed in rows with the headers in every other row reversed so that the pedestals 28 of the headers of one row are disposed adjacent the pedestals 28 of the headers in the adjacent rows, and the pedestals 29 and 30 of the headers in each row are disposed adjacent the pedestals 30 and 29 in the adjacent row.

The top face 20 is essentially planar except for three upwardly extending pedestals 28, 29 and 30 in each header area. The pedestals are elongated in shape and have flat upper surfaces **28*a*, 29*a* and 30*a*, respectively. Contact posts 28*b*, 29*b* and 30*b* extend upwardly from surfaces 28*a*–30*a*, respectively, and have rounded tips to provide a very small area of contact with a flat surface. The posts 28*b*–30*b* may be hemispherical as illustrated in the drawings. The pedestals 28–30 are preferably arranged in a triangular configuration substantially as illustrated in the drawings and are spaced apart so that the semiconductor device 16 may be placed on the flat surface 20 between the posts as shown in FIGURE 5. The pedestals 28–30 are of sufficient height to insure that the upper surfaces 28*a*–30*a* will be disposed above the top of the transistor chip 16. The lead wires 32 and 34 shown in FIGURE 5 will then extend upwardly from the surface of the transistor chip 16 to the bonding surfaces 29*a* and 30*a*** to prevent a shorting contact between the wires and the surface of the transistor.

In accordance with another aspect of the invention, dimples 36, 37 and 38 are formed in the bottom surface 24 in each header area, preferably directly under the pedestals 28, 29 and 30, respectively. The purpose of the dimples 36, 37 and 38 is to facilitate the molding of the pedestals 28, 29 and 30 and, more importantly, to also provide a means for facilitating the ultrasonic welding of the header to the hybrid or other printed circuit as will presently be described.

In a typical embodiment of the invention, each of the header areas is about 0.080 inch square. The wafer is about 0.020 inch in thickness between the upper and lower faces 20 and 24, the break grooves 22 and 26 are about 0.007 inch deep, the pedestals 28–30 are about 0.015 inch high, with the weld posts **28*b*–30*b* extending about 0.005 inch above the ends 28*a*–30*a*** of the pedestals.

After the wafer is fabricated, but before it is separated into the individual headers, a stencil or mask, indicated generally by the reference numeral 12 in FIGURE 4, is placed over the upper surface 20. The stencil 12 has a plurality of elongated stringers 42 which extend transversely across all header areas in a particular row at a point adjacent to the pedestals 29 and 30. As previously mentioned, the header areas 14 in each successive row are reversed so that the pedestals 29 and 30 in one row of header areas are disposed adjacent the pedestals 30 and 29 of the adjacent row of header areas, and similarly, the pedestals 28 of one row of headers are disposed adjacent the pedestals 28 of the adjacent row of headers. Cross strips 43 extend between the pedestals 29 and 30 of each header area and interconnect each adjacent pair of stringers 42. All of the cross stringers 42 may be interconnected within a frame (not illustrated) to provide a single mask stencil. The stencil 12 may conveniently be formed from a metal sheet using any conventional technique, such as a photolithographic and etching technique. It will be noted that the pedestals 29 and 30 provide a convenient means for positively orienting the stencil 12 with respect to the wafer 10.

After the stencil 12 has been placed in position on the wafer 10, the portion of the upper surface 20 exposed through the stencil 12 is sprayed with a suitable metallic material in order to form a metallized layer on the surface. Any conventional method for metallizing the surface of the ceramic or other material used to form the wafer 10 can be employed. For example, the conventional molybdenum-manganese process for metallizing ceramic may be used. In that process, finely ground molybdenum-manganese metal in a suitable liquid binder is sprayed onto the surface exposed through the stencil 12. The stencil is removed and the molybdenum-manganese coat is fired at high temperature to form a metal film which is strongly adherent to the surface of the ceramic material. Successive layers of nickel, silver and gold may then be deposited by electroplating to ultimately provide a layer of soft metal at the outer surface of the metallized layer suitable for ultrasonic welding as will hereafter be described in greater detail.

After the metallized pattern is formed on the upper surface 20, the wafer is separated into the individual header units 14 by breaking along the preferential break grooves 22 and 26. This can be very easily accomplished by placing the wafer between a pair of resilient pads, such as foam rubber pads, and passing an elongated roller over the wafer first in the direction of grooves 26 with sufficient pressure to break the wafer along grooves 22 and then in the direction of grooves 22 with sufficient pressure to break the wafer along the grooves 26. The fabrication of each of the headers 14 is then complete and is in substantially the form illustrated in FIGURE 5, being broken along opposite edges 22*a* and opposite edges 26*a*. It is important to note that after the wafer 10 is broken into the individual headers, the metal film is divided into three separate and electrically isolated metallized areas. One metallized area 44 extends over the pedestal 28, the top 28*a*, and the post 28*b*, a second metallized area 45 extends over pedestal 29, the top 29*a* and post 29*b*, and a third metallized area 46 extends over pedestal 30 including the top 30*a* and the post 30*b*.

Next, the transistor chip 16, or other semiconductor device, is alloyed, or otherwise bonded, to the metallized film 44 so as to both mechanically attach the chip to the header 14 and make electrical contact between the collector of the transistor and the metallized layer 44. Then lead wires 32 and 34 are bonded, or otherwise connected, to the base and emitter contacts of the transistor and to the metallized films 45 and 46 over the tops 29*a* and 30*a* of pedestals 29 and 30, respectively. It will be noted that the tops 29*a* and 30*a* are disposed substantially above the top surface of the semiconductor device 16 so that lead wires 32 and 34 extend upwardly from the chip and are less likely to make shorting contact with the edge of the chip which is a portion of the collector. Thus, the lead wires 32 and 34 place the metallized films 45 and 46 extending over the posts 29*b* and 30*b* in electrical contact with the base and emitter contacts of the transistor.

After the transistor has been mounted on the header 14, it can be encapsulated in a suitable material, such as an epoxy or other plastic, to protect the device during subsequent handling and use. However, care should be taken to keep the epoxy below the ends of the posts 28*b*, 29*b* and 30*b*.

Next, the device illustrated in FIGURE 5 is inverted upon a hybrid or other printed circuit device 18 and aligned so that each of the posts 28*b*–30*b* is positioned on an expanded contact pad. For example, posts 29*b* and 30*b* might be positioned on pads 48 and 50, it being understood that post 28*b* would similarly be placed in contact with a metallized pad. Then the probes of an ultrasonic welder are inserted in the recesses 36, 37 and 38 and the metallized layer over the posts 28*b*–30*b* ultrasonically welded to the expanded pads on the circuit 18 by conventional ultrasonic welding techniques. The recesses 36, 37 and 38 greatly facilitate this ultrasonic welding process in that the very small header 14 can be properly positioned and maintained in the correct position when subjected to the ultrasonic vibrations, which otherwise tend to cause the header to move across the surface of the circuit 18. It is important to note that by providing three weld posts 28*b*, 29*b* and 30*b*, a substantially uniform pressure is applied to each of the weld posts to insure a good ultrasonic bond. The entire hybrid circuit 18 may then be encapsulated in a suitable epoxy or other packaging means to provide the necessary protective ambient for the active semiconductor components in the event the semiconductor components have not already been so encapsulated.

From the above detailed description of preferred embodiments of the invention, it will be noted that a very simple and economical process for fabricating an improved header has been described. The wafers 10 can be pressed from a ceramic powder at an extremely high rate, more than one per second, using a conventional Dorst press, so that the individual headers are formed at a rate of more than one hundred per second. The wafers are sufficiently large, typically almost an inch square, that they can be handled efficiently, either by hand or mechanization. The masks may be quickly placed over the wafer by hand and the metallized film sprayed on the ceramic by hand. After the metallized film has been fired, the wafers are quickly and easily broken into the individual headers. Thus, total handling of each wafer by a worker requires only seconds, and a large number of the headers are produced from each wafer so that the cost per header is very low.

The resulting header can be incorporated in a hybrid circuit using ultrasonic welding techniques. This is made possible by reason of the small contact area of the posts 28*b*–30*b*. The use of only three posts eliminates a great deal of the precision otherwise required to achieve a good ultrasonic weld, and the weld is materially facilitated by the three recesses 36, 37 and 38 formed in the bottom surface for receiving the probes of the ultrasonic welding apparatus.

It is very important that the overall dimension of the header 14 be maintained as small as possible so that the header will occupy a minimum area on the hybrid circuit. The arrangement of parts illustrated reduces the area to a minimum while still satisfying the various criteria for incorporation in a hybrid circuit and for fabrication using the process of this invention.

Although preferred embodiments of the invention have been described in detail, it is to be understood that various changes, substitutions and alterations can be made therein without departing from the spirit and scope of the invention as defined by the appended claims.

What is claimed is:

1. A header for connecting a transistor or the like in a hybrid circuit comprising a body of insulating material having generally flat top and bottom surfaces, a plurality of pedestals extending upwardly from the top surface and disposed in spaced relationship to receive a transistor on the top surface between the pedestals, each pedestal having a rounded tip portion and at least two of the pedestals having intermediate bonding surfaces disposed at a height between the top surface and the tip portions and greater than the height of a transistor on the top surface, and three electrically isolated metallized films on the top surface and pedestals, one metallized film extending over the tip portion and intermediate bonding surface of a pedestal, another metallized film extending over the tip portion and the intermediate bonding surface of another pedestal, and the other metallized film extending over the tip portion of the other pedestal and the portion of the top surface where the transistor is to be mounted.

2. The header defined in claim 1 further characterized by a plurality of recesses formed in the bottom surfaces of the body and respectively aligned with said tip portions for facilitating the bonding of the metal film over the tip portions of the pedestals to a circuit formed on a substrate.

3. A circuit comprising a substrate having conductive pathways thereon and a header for an electronic device to be connected to said conductive pathways, said header comprising an insulating body having generally flat top and bottom surfaces, a plurality of pedestals extending upwardly from said top surface and disposed in space relationship to receive said electronic device on the top surface between said pedestals, said pedestal having a rounded tip portion and at least two of said pedestals having intermediate bonding surfaces disposed at a height between said top surface and the tip portions and greater than the height of said electronic device on said top surface, a respective plurality of electrically isolated metallized films on said top surface and said pedestals, one of said metallized films extending over the tip portion and intermediate bonding surface of one of said pedestals, another one of said metallized films extending over the tip portion and the intermediate bonding surface of another one of said pedestals, and a further one of said metallized films extending over the tip portion of another one of said pedestals and a portion of said top surface, said electronic device being mounted on said further one of said metallized films on said portion of said top surface, electrical connections between said electronic device and said intermediate bonding surfaces, and said tip portions being mounted on and electrically connected to said conductive pathways.

4. A circuit according to claim 3, including a plurality of recesses formed in the bottom surface of said insulating body and respectively aligned with said tip portions for facilitating the mounting of said tip portions on said conductive pathways.

References Cited

UNITED STATES PATENTS

| | | | |
|---|---|---|---|
| 3,271,507 | 9/1966 | Elliott | 174—52 |
| 3,324,212 | 6/1967 | Paulley et al. | 29—625 XR |

DARRELL L. CLAY, *Primary Examiner.*

U.S. Cl. X.R.

29—626, 627; 174—52, 68.5; 317—234